United States Patent
Maruyama et al.

(10) Patent No.: US 7,453,231 B2
(45) Date of Patent: Nov. 18, 2008

(54) ELECTRIC VEHICLE CONTROL DEVICE

(75) Inventors: Takafumi Maruyama, Tokyo (JP); Hideto Negoro, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/792,291

(22) PCT Filed: Apr. 1, 2005

(86) PCT No.: PCT/JP2005/006474

§ 371 (c)(1),
(2), (4) Date: Jun. 5, 2007

(87) PCT Pub. No.: WO2006/114817

PCT Pub. Date: Nov. 2, 2006

(65) Prior Publication Data

US 2008/0100256 A1  May 1, 2008

(51) Int. Cl.
H02P 1/24 (2006.01)
H02P 7/00 (2006.01)

(52) U.S. Cl. .................. 318/807; 318/727; 318/799; 318/801; 318/434; 318/439

(58) Field of Classification Search ............... 318/432, 318/439, 494, 495, 727, 799, 801–811
See application file for complete search history.

(56) References Cited

U.S. PATENT DOCUMENTS 5,689,170 A * 11/1997 Ishikawa ................... 318/811
5,798,628 A *  8/1998 Fujita et al. ............... 318/805
6,274,998 B1 *  8/2001 Kaneko et al. ............. 318/802
6,377,017 B2 *  4/2002 Kondou et al. ............. 318/727

(Continued)

FOREIGN PATENT DOCUMENTS

JP    6-245301 A    9/1994

(Continued)

OTHER PUBLICATIONS

International Search Report dated Jul. 19, 2005.

*Primary Examiner*—Paul Ip
(74) *Attorney, Agent, or Firm*—Buchanan Ingersoll & Rooney PC

(57) ABSTRACT

An object of the present invention is to provide an electric vehicle control device which is capable of detecting even a state in which only one phase of one induction motor is disconnected in a system where a plurality of induction motors are connected in parallel with each other and driven by one vector-controlled inverter device. The electric vehicle control device according to the present invention includes a torque calculation unit (5) for calculating the torque of the induction motor on the basis of a q-axis current I1q, a d-axis current I1d, a q-axis voltage command E1qr, a d-axis voltage command E1dr, and an inverter angular frequency ωinv, which are obtained by a vector control unit (2), a torque variation width calculation unit (6) that calculates the torque variation width from a maximum value and a minimum value of a torque calculation result in a predetermined time width on the basis of the torque calculation result, and a comparator (7) that outputs a disconnection detection signal when the torque variation width exceeds the torque variation width reference value.

4 Claims, 4 Drawing Sheets

U.S. PATENT DOCUMENTS

| | | | |
|---|---|---|---|
| 6,388,419 B1 * | 5/2002 | Chen et al. | 318/727 |
| 6,683,428 B2 * | 1/2004 | Pavlov et al. | 318/432 |
| 6,879,125 B2 * | 4/2005 | Akatsu | 318/495 |
| 7,084,603 B2 * | 8/2006 | Taguchi et al. | 318/808 |

FOREIGN PATENT DOCUMENTS

| | | |
|---|---|---|
| JP | 2005-176571 A | 6/2005 |

\* cited by examiner

ELECTRIC VEHICLE CONTROL DEVICE

TECHNICAL FIELD

The present invention relates to an electric vehicle control device, and more particularly, to an electric vehicle control device having a function of detecting the disconnection of a motor wire that supplies an AC power to an induction motor from an inverter device.

BACKGROUND ART

An open phase detecting system of a conventional electric vehicle control device obtains the average values Iu, Iv, and Iw of the respective phase currents of a three-phase AC current which is outputted by the inverter device, finds values Io=(Iu+Iv +Iw)/3 which result from further averaging the average values of those respective phase currents, and detects open phase when differences |Iu−Io|, |Iv−Io|, and |Iw−Io| between the average values of the respective phase currents and the further averaged value exceed a reference value.

Patent Document 1: JP 06-245301 A

DISCLOSURE OF THE INVENTION

Problems to be Solved by the Invention

In the above conventional electric vehicle control device, in the case of a system in which a plurality of, for example, four induction motors are connected in parallel with each other and driven by one vector-controlled inverter device, there arises such a problem that a state in which only one phase of one induction motor among those four induction motors is disconnected cannot be detected. This is because a current of the induction motor is controlled at a high speed by the vector control with the result that the respective phase average currents of the four induction motors do not change even if one phase of one induction motor is disconnected, and therefore the differences |Iu−Io|, |Iv−Io|, and |Iw−Io| do not exceed the reference value.

The present invention has been made to solve the above problem, and therefore an object of the present invention is to provide an electric vehicle control device which is capable of detecting even a state in which only one phase of one induction motor is disconnected in a system where a plurality of induction motors are connected in parallel with each other and driven by one vector-controlled inverter device.

Means for Solving the Problems

The present invention provides an electric vehicle control device that vector-controls an induction motor by an inverter device, the electric vehicle control device including: a vector control unit for calculating a q-axis current $I1q$, a d-axis current $I1d$, a q-axis voltage command $E1qr$, a d-axis voltage command $E1dr$, and an inverter angular frequency $\omega inv$ of the induction motor; a torque calculation unit for calculating the torque of the induction motor on the basis of the q-axis current $I1q$, the d-axis current $I1d$, the q-axis voltage command $E1qr$, the d-axis voltage command $E1dr$, and the inverter angular frequency $\omega inv$; a torque variation width calculation unit for calculating the torque variation width from a maximum value and a minimum value of a torque calculation result in a predetermined time width on the basis of the torque calculation result that is calculated by the torque calculation unit; and a comparator for comparing the torque variation width that is calculated by the torque variation width calculation unit with a predetermined torque variation reference value to output a disconnection detection signal when the torque variation width exceeds the torque variation width reference value.

Effect of the Invention

According to the present invention, attention is paid to the fact that the torque of the induction motor is calculated on the basis of the q-axis current $I1q$, the d-axis current $I1d$, the q-axis voltage command $E1qr$, the d-axis voltage command $E1dr$, and the inverter angular frequency $\omega inv$, which are obtained by the vector control unit, and the torque calculation result changes when only one phase of one induction motor is disconnected in a system in which a plurality of induction motors are connected in parallel with each other and driven by one vector-controlled inverter device, and a torque variation width and a torque variation reference value are compared with each other to detect the disconnection. As a result, the state in which even only one phase of one induction motor is disconnected in the system where a plurality of induction motors are connected in parallel with each other and driven by one vector-controlled inverter device can be detected.

BEST MODE FOR CARRYING OUT THE INVENTION

FIRST EMBODIMENT

Figure 1:
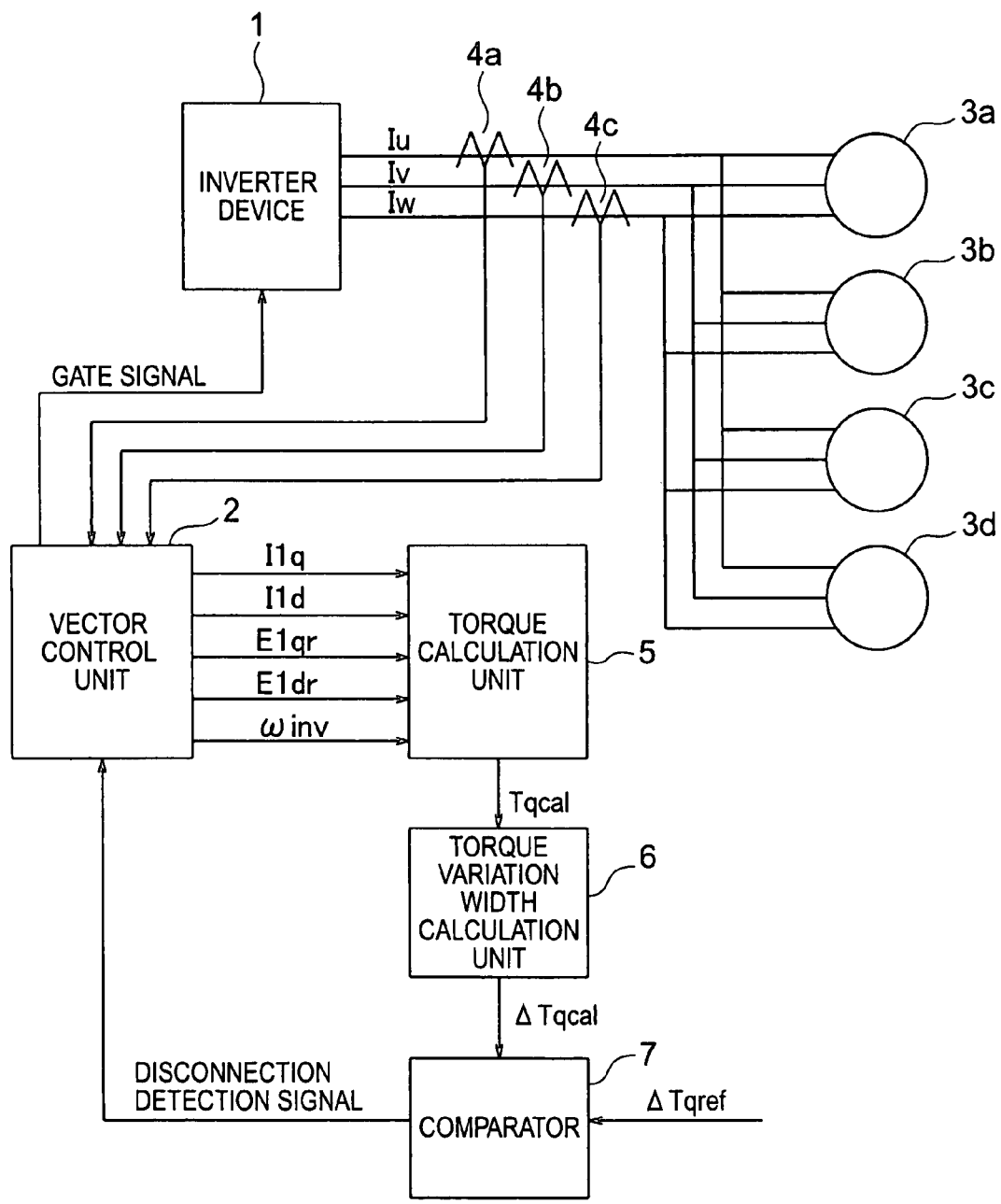
FIG. 1 is a structural diagram showing an electric vehicle control device according to a first embodiment of the present invention.

FIG. 1 shows an electric vehicle control device according to a first embodiment of the present invention. As shown in FIG. 1, an inverter device 1 is connected with four induction motors 3a, 3b, 3c, and 3d. Those four induction motors 3a, 3b, 3c, and 3d are connected in parallel with the inverter device 1, and controlled in vector by the one inverter device 1. The inverter device 1 is connected with a vector control unit 2, and the inverter device 1 switches over a switching element (not shown) that is disposed in the interior of the inverter device 1 according to a gate signal which is outputted from the vector control unit 2, to thereby supply an electric power to the four induction motors 3a, 3b, 3c, and 3d which are connected in parallel with the inverter device 1. The respective phase currents Iu, Iv, and Iw which are outputted from the inverter device 1 are detected by phase current detection CTs 4a, 4b, and 4c, and then inputted to the vector control unit 2. A q-axis current $I1q$, a d-axis current $I1d$, a q-axis voltage command $E1qr$, a d-axis voltage command $E1dr$, and an inverter angular frequency $\omega inv$ of the induction motor, which are obtained in a process of a vector control calculation which is implemented by the vector control unit 2, are inputted to a torque calculation unit 5 from the vector control unit 2. A torque calculation result Tqcal is calculated in the torque calculation unit 5 on the basis of those inputted values. The torque calculation result Tqcal that has been calculated by the torque calculation unit 5 is inputted to a torque variation width calculation unit 6. A torque variation width ΔTqcal which has been calculated in the torque variation width calculation unit 6 is inputted to a comparator 7. In the comparator 7, a predetermined torque variation width reference value ΔTqref and the torque variation width ΔTqcal are compared with each other, and a disconnection detection signal is outputted to the vector control unit 2 on the basis of a comparison result.

Subsequently, the operation will be described. In the torque calculation unit 5, calculation of the following expressions (Ex. 1) to (Ex. 5) is implemented on the basis of the q-axis current I1$q$, the d-axis current I1$d$, the q-axis voltage command E1$qr$, the d-axis voltage command E1$dr$, and the inverter angular frequency ωinv, which have been inputted from the vector control unit 2, to thereby obtain the torque calculation result Tqcal.

The calculation of d-axis and q-axis primary magnetic fluxes Φ1$d$ and Φ1$q$ of the induction motor:

$$\Phi 1d=(E1qr-R1\cdot I1q-s\Phi 1q)/\omega inv \quad \text{(Ex. 1)}$$

$$\Phi 1q=(-E1dr+R1\cdot I1d+s\Phi 1d)/\omega inv \quad \text{(Ex. 2)}$$

The calculation of d-axis and q-axis secondary currents I2$d$ and I2$q$ of the induction motor:

$$I2d=(\Phi 1d-L1\cdot I1d)/M \quad \text{(Ex. 3)}$$

$$I2q=(\Phi 1q-L1\cdot I1q)/M \quad \text{(Ex. 4)}$$

The calculation of the torque Tqcal of the induction motor:

$$Tqcal=pM(I1q\cdot I2d-I1d\cdot I2q) \quad \text{(Ex. 5)}$$

In the expressions, R1 is a primary resistance of the induction motor, s is a differential operator, L1 is a primary self-inductance of the induction motor, M is a mutual inductance of the induction motor, and p is a pole logarithm of the induction motor. Since the torque is calculated through (Ex. 1) to (Ex. 5) as described above, it is possible to calculate an accurate torque in a short time.

Figure 2:
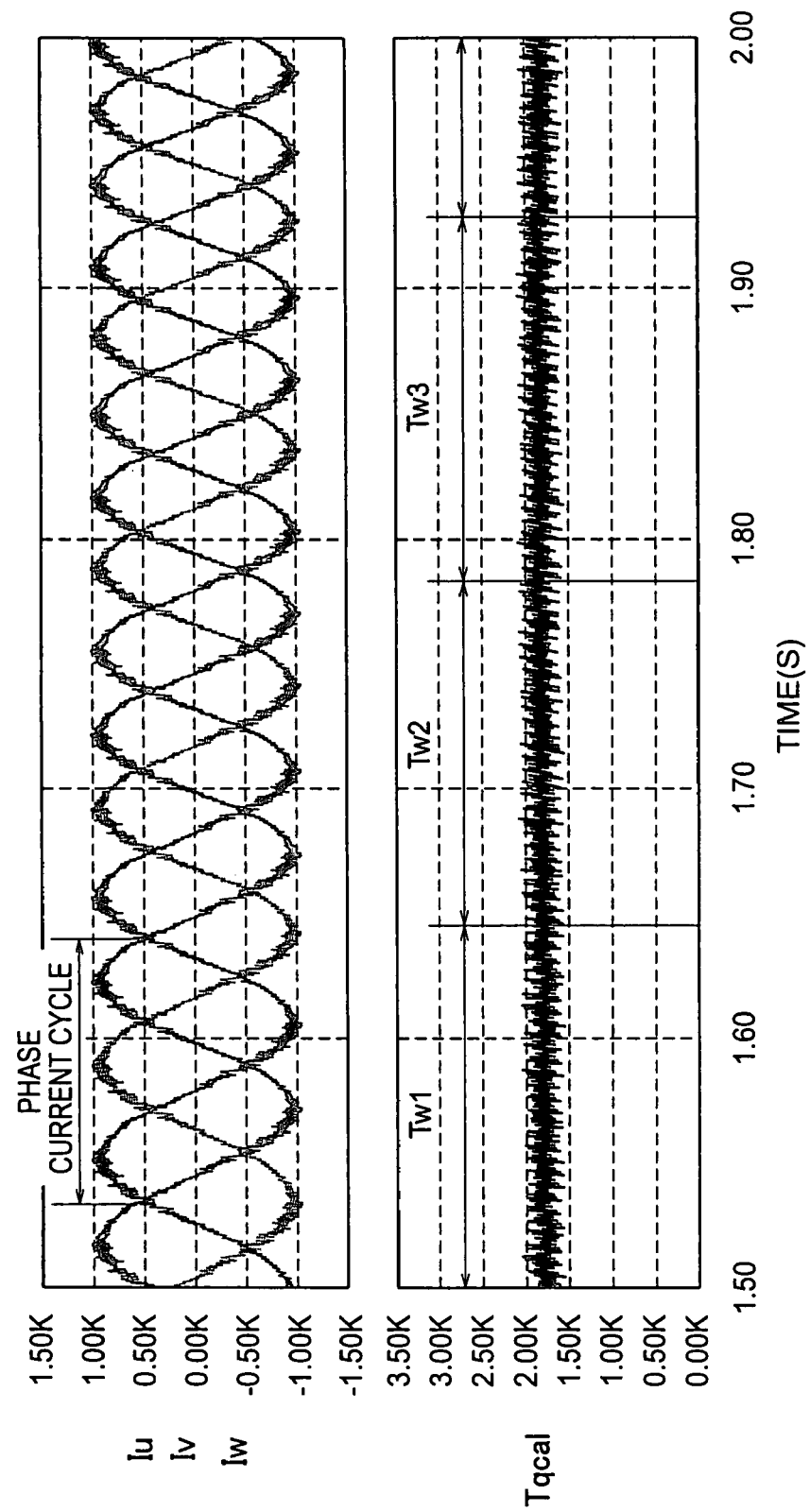
FIG. 2 is an explanatory diagram showing the waveforms of the respective phase currents and torque calculation results in the electric vehicle control device in a normal state according to the first embodiment of the present invention.

FIG. 2 shows a waveform example of the respective phase currents Iu, Iv, and Iw, and the torque calculation result Tqcal in a normal state where there is no disconnection of the respective phase wires between the induction motors 3$a$, 3$b$, 3$c$, and 3$d$ which are connected in parallel with the inverter device 1. In the torque variation width calculation unit 6, the maximum value and the minimum value of the torque calculation result Tqcal in a set time width Tw (corresponding to Tw1, Tw2, and Tw3 of FIG. 2) are obtained to calculate the torque variation width ΔTqcal within the time width Tw. For example, when it is assumed that the maximum value of the torque calculation results within Tw1 of FIG. 2 is Tqmax and the minimum value of the torque calculation results within Tw1 is Tqmin, the torque variation width within Tw1 is calculated with ΔTqcal =Tqmax−Tqmin.

The torque variation width ΔTqcal that has been calculated by the torque variation width calculation unit 6 is compared with a torque variation width reference value ΔTqref by the comparator 7 to output a disconnection detection signal according to the following logical table.

TABLE 1

| Logical expression | Disconnection detection signal |
| --- | --- |
| \|ΔTqcal\| ≦ ΔTqref | 0 (Not disconnected) |
| \|ΔTqcal\| > ΔTqref | 1 (Disconnected) |

In a state shown in FIG. 2, since the torque variation width ΔTqcal is smaller than the torque variation width reference value ΔTqref, and the disconnection detection signal is "0" as shown in the above logical table, a gate signal that is determined according to the vector control result is inputted to the inverter device 1 from the vector control unit 2.

Figure 3:
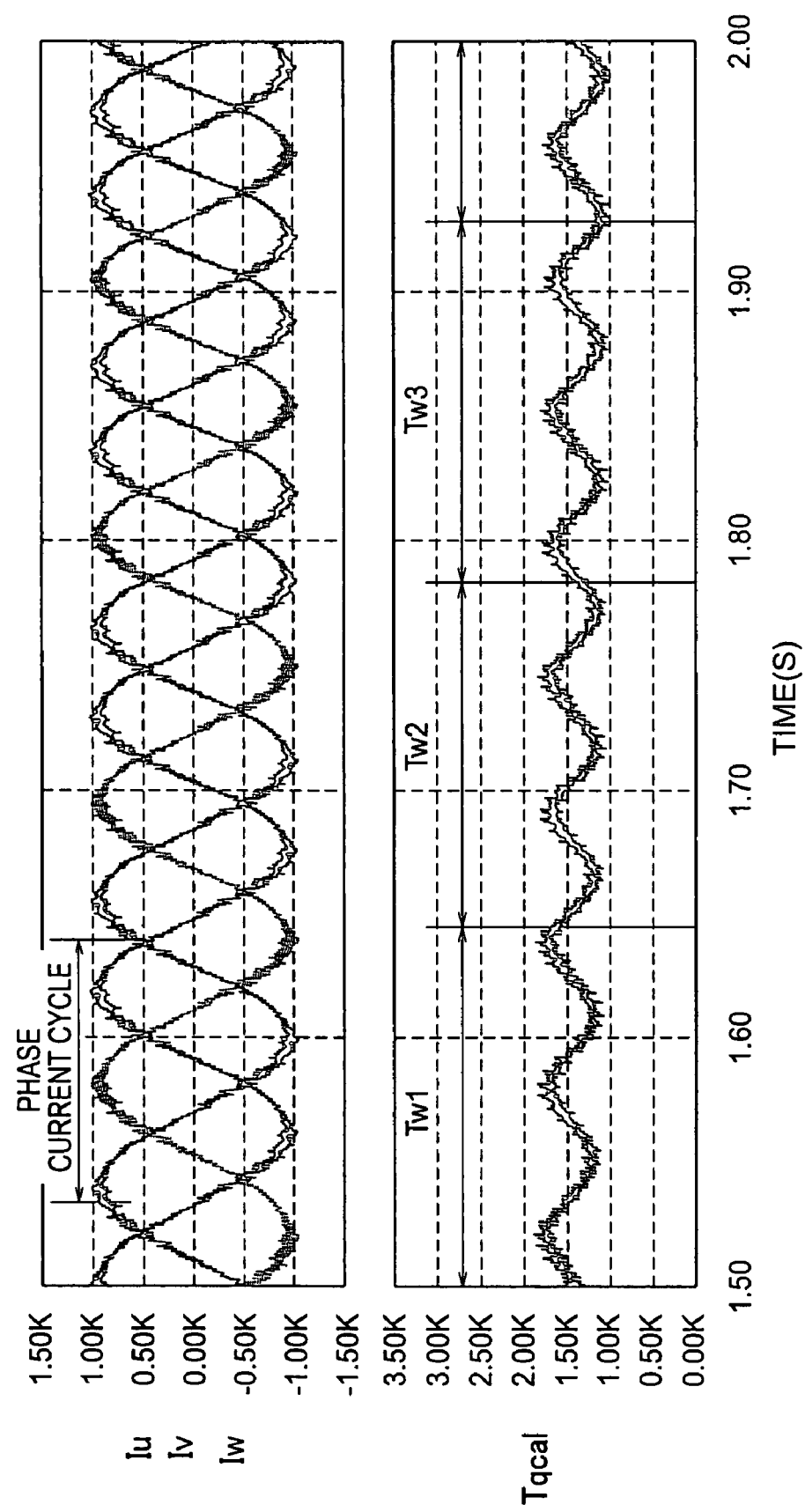
FIG. 3 shows the waveforms of the respective phase current and torque calculation results in a state where a W-phase of one induction motor is disconnected in the electric motor control device according to the first embodiment of the present invention.
Figure 4:
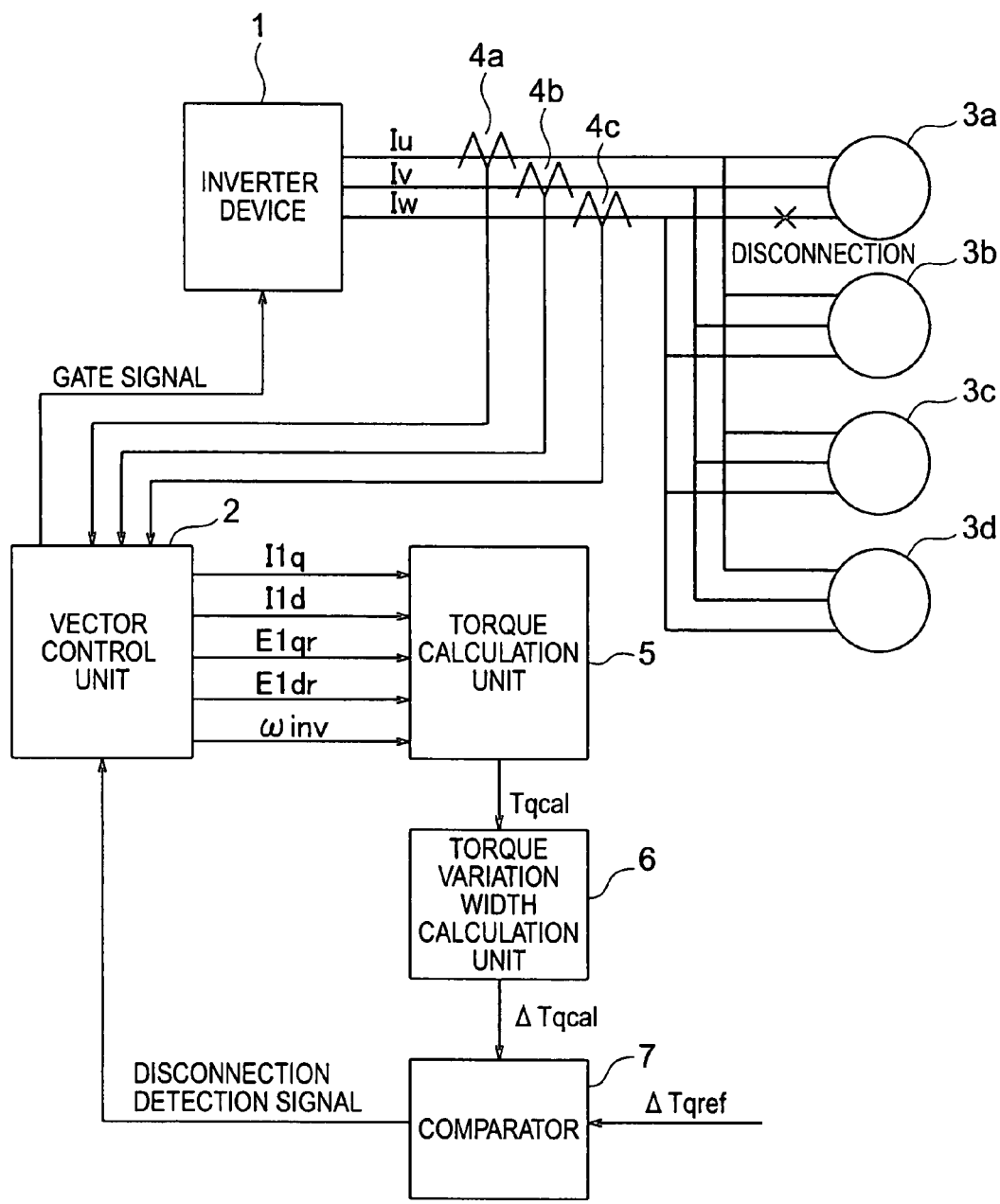
FIG. 4 is an explanatory diagram showing a state in which a W-phase of one induction motor is disconnected in the electric vehicle control device according to the first embodiment of the present invention.

However, a description will be given of a case in which one wire of W-phase of the induction motor 3$a$ is disconnected among the respective phase wires between the induction motors 3$a$, 3$b$, 3$c$, and 3$d$ which are connected in parallel with the inverter device 1, for example, as shown in FIG. 4, in the structure of FIG. 1. FIG. 3 shows a waveform example of the respective phase currents Iu, Iv, and Iw, and the torque calculation result Tqcal in that case.

As is apparent from FIG. 3, the waveforms of the respective phase currents Iu, Iv, and Iw hardly change from the waveforms in a normal time shown in FIG. 2, but the torque calculation result Tqcal varies at a frequency twice as much as the frequency of the respective phase currents. Also, since the absolute value of the torque variation width ΔTqcal becomes larger than the torque variation width reference value ΔTqref, the disconnection detection signal becomes "1" as shown in the above logical table. Upon inputting the disconnection detection signal "1", the vector control unit 2 stops the gate signal, and suspends the supply of an electric power to the induction motors 3$a$, 3$b$, 3$c$, and 3$d$ from the inverter device 1.

The processing of the vector control unit 2, the torque calculation unit 5, the torque variation width calculation unit 6, and the comparator 7 is normally implemented through digital calculation by means of a microcomputer or a digital signal processor.

As described above, according to the present invention, attention is paid to the fact that the torque of the induction motor is calculated on the basis of the q-axis current I1$q$, the d-axis current I1$d$, the q-axis voltage command E1$qr$, the d-axis voltage command E1$dr$, and the inverter angular frequency ωinv, which are obtained by the vector control unit, and the torque calculation result changes when only one phase of one induction motor is disconnected in a system in which a plurality of induction motors are connected in parallel with each other and driven by one vector-controlled inverter device, and the torque variation width and the torque variation reference value are compared with each other to detect the disconnection. As a result, even the state in which only one phase of one induction motor is disconnected in the system where a plurality of induction motors are connected in parallel with each other and driven by one vector-controlled inverter device can be detected.

Also, according to the present invention, since the torque calculation result largely varies even in a state where there is no gate signal or even in a state where the inverter device output is disconnected, it is possible to detect those abnormalities.

In the above description, the number of induction motors is four, but the present invention is not limited to the above case, and the number of induction motors may be 1, 2, 5, 6 or others. Also, in FIGS. 1 and 4, the respective phase current detection CTs are provided for three phases, but the present invention is not limited to this case, and, for example, only the CTs 4*a* and 4*b* may be provided for detecting Iu and Iv. In this case, Iw is calculated as Iw=−(Iu+Iv) by the vector control unit 2.

Also, the time width Tw when calculating the torque variation width can be any appropriate time width, but may be determined as follows. As is apparent from FIG. 3, the variation frequency of the torque calculation result Tqcal is twice as much as the frequency of the phase current. Taking this fact into consideration, the time width Tw when calculating the torque variation width is set to be more than ½ of the cycle of the phase current at the time of calculation. With the above setting, since the time width Tw is always equal to or larger than the torque variation cycle, the torque variation width ΔTqcal can be accurately calculated.

The invention claimed is:

1. An electric vehicle control device, which vector-controls an induction motor by an inverter device, the electric vehicle control device comprising:
   a vector control unit for calculating a q-axis current I1q, a d-axis current I1d, a q-axis voltage command E1qr, a d-axis voltage command E1dr, and an inverter angular frequency ωinv of the induction motor;
   a torque calculation unit for calculating the torque of the induction motor on the basis of the q-axis current I1q, the d-axis current I1d, the q-axis voltage command E1qr, the d-axis voltage command E1dr, and the inverter angular frequency ωinv;
   a torque variation width calculation unit for calculating the torque variation width from a maximum value and a minimum value of a torque calculation result in a predetermined time width on the basis of the torque calculation result that is calculated by the torque calculation unit; and
   a comparator for comparing the torque variation width that is calculated by the torque variation width calculation unit with a predetermined torque variation width reference value to output a disconnection detection signal when the torque variation width exceeds the torque variation width reference value.

2. An electric vehicle control device according to claim 1, wherein the predetermined time width in the torque variation width calculation unit is set to be ½ or more of a cycle of a phase current.

3. An electric vehicle control device according to claim 1 wherein the torque calculation unit calculates d-axis and q-axis primary magnetic fluxes and d-axis and q-axis secondary currents of the induction motor on the basis of the q-axis current I1q, the d-axis current I1d, the q-axis voltage command E1qr, the d-axis voltage command E1dr, and the inverter angular frequency ωinv to calculate the torque from the d-axis and q-axis primary magnetic fluxes and the d-axis and q-axis secondary currents.

4. An electric vehicle control device according to claim 2, wherein the torque calculation unit calculates d-axis and q-axis primary magnetic fluxes and d-axis and q-axis secondary currents of the induction motor on the basis of the q-axis current I1q, the d-axis current I1d, the q-axis voltage command E1qr, the d-axis voltage command E1dr, and the inverter angular frequency ωinv to calculate the torque from the d-axis and q-axis primary magnetic fluxes and the d-axis and q-axis secondary currents.

* * * * *